(12) United States Patent
Namiki et al.

(10) Patent No.: US 9,670,384 B2
(45) Date of Patent: Jun. 6, 2017

(54) LIGHT-REFLECTIVE ANISOTROPIC CONDUCTIVE ADHESIVE AND LIGHT-EMITTING DEVICE

(75) Inventors: Hidetsugu Namiki, Tochigi (JP); Shiyuki Kanisawa, Tochigi (JP); Hideaki Umakoshi, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/004,553

(22) PCT Filed: Feb. 24, 2012

(86) PCT No.: PCT/JP2012/054568
§ 371 (c)(1),
(2), (4) Date: Sep. 11, 2013

(87) PCT Pub. No.: WO2012/127978
PCT Pub. Date: Sep. 27, 2012

(65) Prior Publication Data
US 2014/0001419 A1    Jan. 2, 2014

(30) Foreign Application Priority Data
Mar. 18, 2011    (JP) ................. 2011-060700

(51) Int. Cl.
*H01B 1/22* (2006.01)
*C09J 9/02* (2006.01)
(Continued)

(52) U.S. Cl.
CPC    *C09J 9/02* (2013.01); *C08K 9/02* (2013.01); *C09J 11/04* (2013.01); *H01B 1/22* (2013.01);
(Continued)

(58) Field of Classification Search
CPC ....... H01L 2924/00; H01L 2224/16225; H01L 2224/32225; H01L 2224/45144;
(Continued)

(56) References Cited

U.S. PATENT DOCUMENTS 4,859,364 A * 8/1989 Yamamoto et al. .......... 252/512
6,184,280 B1 * 2/2001 Shibuta ........................ 524/405
(Continued)

FOREIGN PATENT DOCUMENTS

CN    101061398 A    10/2007
EP    0 716 117 A1    6/1996
(Continued)

OTHER PUBLICATIONS

Dec. 8, 2014 Extended European Search Report issued in Application No. 12760304.1.
(Continued)

*Primary Examiner* — Mark Kopec
*Assistant Examiner* — Jaison Thomas
(74) *Attorney, Agent, or Firm* — Oliff PLC

(57) ABSTRACT

A light-reflective anisotropic conductive adhesive used for anisotropic conductive connection of a light-emitting element to a wiring substrate includes a thermosetting resin composition, conductive particles, and light-reflective insulating particles. The light-reflective insulating particles are formed by subjecting titanium oxide particles to a surface treatment with one kind selected from the group consisting of $Al_2O_3$, SiO, $SiO_2$, ZnO, $ZnO_2$, and $ZrO_2$. The amount of the titanium oxide contained in the light-reflective insulating particles is 85 to 93%. The particle diameter of the light-reflective insulating particles is 0.2 to 0.3 μm, and the particle diameter of the conductive particles is 2 to 10 μm.

18 Claims, 4 Drawing Sheets

(51) Int. Cl.
| | |
|---|---|
| H01R 4/04 | (2006.01) |
| H01L 33/60 | (2010.01) |
| H05B 33/22 | (2006.01) |
| C09J 11/04 | (2006.01) |
| C08K 9/02 | (2006.01) |
| C09J 163/00 | (2006.01) |
| C08K 3/22 | (2006.01) |
| C08G 59/42 | (2006.01) |

(52) U.S. Cl.
CPC ............ *H01L 33/60* (2013.01); *H01R 4/04* (2013.01); *H05B 33/22* (2013.01); *C08G 59/42* (2013.01); *C08K 3/22* (2013.01); *C08K 2003/2237* (2013.01); *C09J 163/00* (2013.01); *H01L 2224/16225* (2013.01); *H01L 2224/32225* (2013.01); *H01L 2224/45144* (2013.01); *H01L 2224/48091* (2013.01); *H01L 2224/73204* (2013.01); *H01L 2224/73265* (2013.01); *H01L 2924/07811* (2013.01); *H01L 2924/3025* (2013.01)

(58) Field of Classification Search
CPC . H01L 2224/48091; H01L 2224/73204; H01L 2924/07811; H01L 2924/3025; H01L 2924/00014; H01L 2224/73265; H01L 33/60; C08G 59/42
See application file for complete search history.

(56) References Cited

U.S. PATENT DOCUMENTS

| | | | |
|---|---|---|---|
| 7,815,727 B2* | 10/2010 | Kawato | C08K 9/02 106/400 |
| 2005/0272857 A1 | 12/2005 | Kawato et al. | |
| 2008/0136998 A1 | 6/2008 | Sakata et al. | |
| 2012/0193666 A1* | 8/2012 | Namiki et al. | 257/98 |

FOREIGN PATENT DOCUMENTS

| | | |
|---|---|---|
| JP | A-11-168235 | 6/1999 |
| JP | A-2006-145919 | 6/2006 |
| JP | 2007-270099 A | 10/2007 |
| JP | A-2010-168266 | 8/2010 |
| JP | 2011-054902 A | 3/2011 |
| WO | WO 2004/044044 A1 | 5/2004 |
| WO | 2011/030746 A1 | 3/2011 |
| WO | WO 2011/030621 A1 | 3/2011 |

OTHER PUBLICATIONS

International Search Report issued in International Application No. PCT/JP2012/054568 dated May 29, 2012.
Jun. 25, 2013 International Preliminary Report on Patentability issued in International Application No. PCT/JP2012/054568 (with translation).
May 6, 2015 Office Action issued in Chinese Application No. 201280013996.9.
Aug. 25, 2015 Office Action issued in Japanese Application No. 2012-045401.
Mar. 4, 2016 Communication cited in European Application No. 12760304.1.
Jan. 21, 2016 Office Action issued in Taiwanese Patent Application No. 101106690.
Zhao-De et al., "Light Stabilizer and Applications Thereof," pp. 96-100, China Light Industry Press, Jan. 2010.
Dec. 25, 2015 Office Action issued in Chinese Application No. 201280013996.9.
Jun. 2, 2016 Office Action issued in Chinese Application No. 201280013996.9.
Aug. 5, 2016 Office Action issued in Taiwanese Application No. 101106690.
Jan. 12, 2017 Notice of Reexamination cited in Chinese Application No. 201280013996.9.

* cited by examiner

US 9,670,384 B2

LIGHT-REFLECTIVE ANISOTROPIC CONDUCTIVE ADHESIVE AND LIGHT-EMITTING DEVICE

TECHNICAL FIELD

The present invention relates to a light-reflective anisotropic conductive adhesive used for anisotropic conductive connection of a light-emitting element to a wiring substrate, and a light-emitting device in which a light-emitting element is mounted on a wiring substrate with the adhesive.

BACKGROUND ART

Light-emitting devices that use a light emitting diode (LED) element are widely used. A light-emitting device of the previous type has a structure in which an LED element 33 is bonded to a substrate 31 with a die bond adhesive 32, a p electrode 34 and an n electrode 35 thereon are wire-bonded to a connecting terminal 36 of the substrate 31 with a gold wire 37, and the whole LED element 33 is sealed with a transparent mold resin 38, as shown in FIG. 3. However, in the light-emitting device of FIG. 3, of beams of light emitted by the LED element 33, beams of light having a wavelength of 400 to 500 nm that are output to an upper face side are absorbed by the gold wire 37. Further, part of beams of light output to a lower face side is absorbed by the die bond adhesive 32. Thus, there has been a problem of reduced light-emitting efficiency of the LED element 33.

For this reason, as shown in FIG. 4, flip-chip mounting of an LED element 33 has been proposed (Patent Literature 1). In this flip-chip mounting technique, bumps 39 formed are provided to a p electrode 34 and an n electrode 35, respectively, and a light-reflective layer 40 is provided on a bump-forming face of the LED element 33 so that the p electrode 34 and the n electrode 35 are insulated from each other. The LED element 33 and the substrate 31 are connected and fixed by curing an anisotropic conductive paste 41 or an anisotropic conductive film (not shown). Therefore, in the light-emitting device of FIG. 4, the light output upward of the LED element 33 is not absorbed by a gold wire and most of the light output downward reflects on the light-reflective layer 40 and is output upward. Thus, the light-emitting efficiency (light extraction efficiency) is not reduced.

CITATION LIST

Patent Literature

Patent Literature 1: Japanese Patent Application Laid-Open No. Hei. 11-168235

SUMMARY OF INVENTION

Technical Problem

However, in the techniques of Patent Literature 1, the light-reflective layer 40 needs to be provided on the LED element 33 through a metal deposition method or the like so that the p electrode 34 and the n electrode 35 are insulated from each other, and therefore there has been a problem in which the production cost inevitably becomes higher.

On the other hand, without a light-reflective layer 40, the surface of conductive particles coated with gold, nickel, or copper in a cured anisotropic conductive paste or an anisotropic conductive film is brown or dark brown. Further, an epoxy resin binder itself in which the conductive particles are dispersed is brown because of an imidazole-based latent curing agent commonly used to cure the binder. Therefore, there has been a problem in which it is difficult to improve the light-emitting efficiency (light extraction efficiency) of light emitted by a light-emitting element.

An object of the present invention is to solve the above-described problems in the conventional techniques, and to provide an anisotropic conductive adhesive capable of improving light-emitting efficiency even when a light-reflective layer that may increase the production cost is not provided to a light-emitting diode (LED) element during production of a light-emitting device by flip-chip mounting a light-emitting element such as a LED element on a wiring substrate with the anisotropic conductive adhesive, and a light-emitting device produced by flip-chip mounting a light-emitting element on a wiring substrate with the adhesive.

Solution to Problem

The present inventors have found that the light-emitting efficiency of a light-emitting element can be prevented from being reduced by mixing high refractive titanium oxide particles as light-reflective insulating particles in an anisotropic conductive adhesive under the assumption that when the anisotropic conductive adhesive has a light reflection function, the light-emitting efficiency can be prevented from being reduced. When a light-reflective anisotropic conductive adhesive containing titanium oxide particles having a surface exhibiting a high photocatalytic action is applied to a light-emitting device, there is a concern of photodegradation of an organic substance contained in a cured adhesive. However, the present inventors have found that such a concern is solved by treating the surface of titanium oxide particles so that the surface is coated with a metal oxide such as aluminum oxide. Based on these findings, the present inventors have completed the present invention.

Specifically, the present invention provides a light-reflective anisotropic conductive adhesive used for anisotropic conductive connection of a light-emitting element to a wiring substrate, the light-reflective anisotropic conductive adhesive containing a thermosetting resin composition, conductive particles, and light-reflective insulating particles, wherein the light-reflective insulating particles are titanium oxide particles subjected to a surface treatment with a metal oxide other than titanium oxide.

Furthermore, the present invention provides a light-emitting device produced by flip-chip mounting a light-emitting element on a wiring substrate through the light-reflective anisotropic conductive adhesive described above.

Advantageous Effects of Invention

The light-reflective anisotropic conductive adhesive of the present invention used for anisotropic conductive connection of a light-emitting element to a wiring substrate contains light-reflective insulating particles formed by being subjected to a surface treatment of high refractive titanium oxide particles with a metal oxide. Accordingly, the light-reflective anisotropic conductive adhesive can reflect light. Further, since the titanium oxide particles are subjected to a surface treatment with a metal oxide other than titanium oxide (hereinafter, "metal oxide" as described herein means a metal oxide other than titanium oxide), the titanium oxide particles themselves do not come into direct contact with an organic substance in a cured product of the adhesive. Therefore, even when the light-reflective anisotropic conductive adhesive is applied during mounting of a light-emitting element on a wiring substrate in a light-emitting device, an organic substance contained in a cured adhesive can be prevented from being photodegraded.

Further, when light-reflective conductive particles each having a core particle coated with a metal material and a white to gray light-reflective layer formed from zinc oxide (ZnO) particles or aluminum oxide ($Al_2O_3$) particles on the surface thereof is used as conductive particles, since the light-reflective conductive particles themselves are white to gray, the wavelength dependence of reflectivity to the visible light is low. Therefore, the light-emitting efficiency can be further improved, and the light-emitting color of the light-emitting element can be reflected as the original color.

DESCRIPTION OF EMBODIMENTS

Figure 1A:
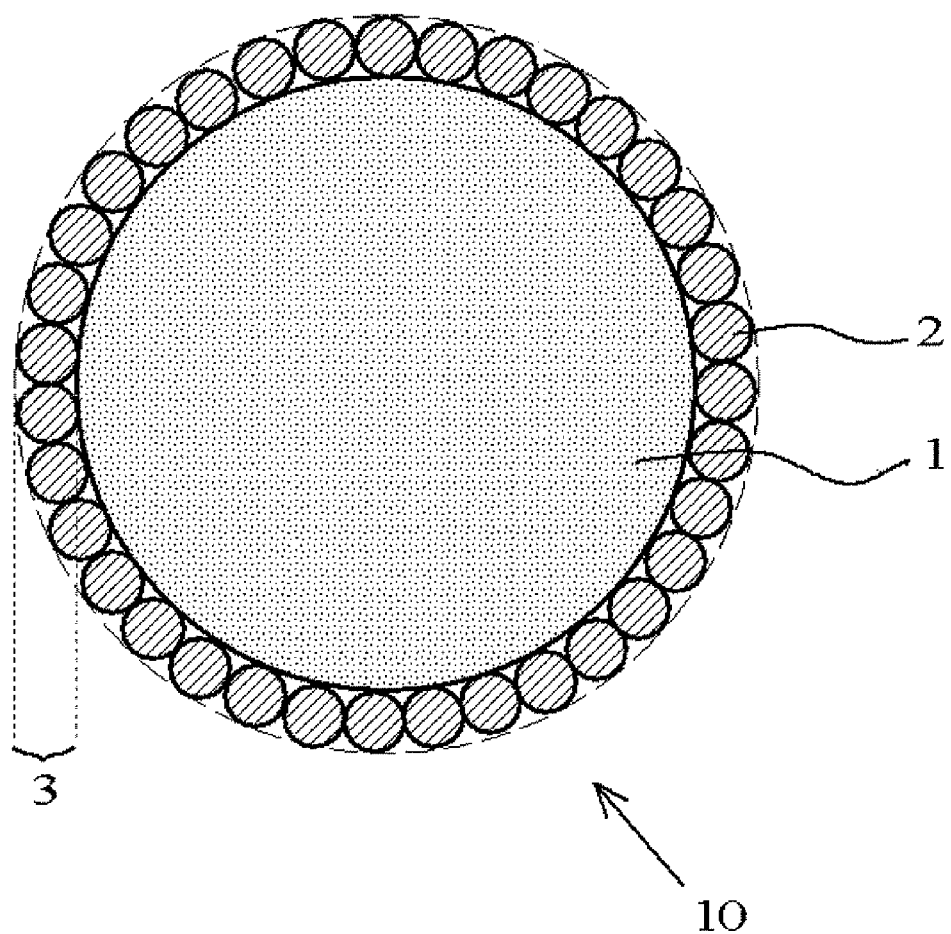
FIG. 1A is a cross-sectional view of a light-reflective conductive particle for an anisotropic conductive adhesive.

The present invention provides a light-reflective anisotropic conductive adhesive used for anisotropic conductive connection of a light-emitting element to a wiring substrate, the light-reflective anisotropic conductive adhesive containing a thermosetting resin composition, conductive particles, and light-reflective insulating particles. In this configuration, as the light-reflective insulating particles for reflecting beams of light incident on the anisotropic conductive adhesive outward, titanium oxide particles subjected to a surface treatment with a metal oxide are used.

In the present invention, the reason for use of titanium oxide ($TiO_2$) particles as the light-reflective insulating particles is that the refractive index thereof is higher than that of an adhesive component as an organic substance and the white shielding property thereof is high. Both of rutile type titanium oxide and anatase type titanium oxide can be used. Since the refractive index of the rutile type titanium oxide is higher than that of the anatase type titanium oxide, the rutile type titanium oxide can be preferably used.

Further, the reason for performing a surface treatment of titanium oxide particles with a metal oxide is to prevent the titanium oxide particles from coming in direct contact with a cured product of the adhesive so that the organic substance contained in the cured product of the adhesive is not photodegraded due to the high photocatalytic action of the titanium oxide.

The metal oxide for use in performing a surface treatment of titanium oxide particles needs light reflectivity and insulating property. Specific examples thereof may be at least one kind selected from the group consisting of aluminum oxide ($Al_2O_3$), silicon oxide (SiO), silicon dioxide ($SiO_2$), zinc oxide (ZnO), zinc dioxide ($ZnO_2$), and zirconium oxide ($ZrO_2$). At least $Al_2O_3$ is preferably used. However, since $SiO_2$ itself has a comparatively low refractive index, it is considered that $SiO_2$ scarcely affect the high refractive index of titanium oxide.

As a procedure for performing a surface treatment of titanium oxide particles with a metal oxide, any known dry or wet surface treatment process can be adopted. Examples of the dry surface treatment process may include a vacuum deposition method, a CVD method, a sputtering method, and a mechano-fusion method. Further, examples of the wet surface treatment process may include a method of dispersing titanium oxide particles in a colloidal metal oxide to cause the titanium oxide particles to adsorb the metal oxide onto the surface thereof, and a method of adding a metal halide or a metal alkoxide to an aqueous dispersion of titanium oxide particles, and if necessary, performing hydrolysis with hydrochloric acid or the like, to form a coating film of a metal oxide.

Hereinafter, examples (A) and (B) in which titanium oxide particles are subjected to a surface treatment with $Al_2O_3$ in accordance with the wet surface treatment process will be described.

(A) Titanium oxide particles as a raw material are dispersed in water to obtain an aqueous slurry, and a surface treatment agent such as sodium aluminate, aluminum sulfate, aluminum nitrate, or aluminum chloride is added to the resulting aqueous slurry to cause the titanium oxide particles to adsorb the surface treatment agent onto the surface thereof. The titanium oxide particles are dried, fired, and ground. Thus, the titanium oxide particles having a surface coated with $Al_2O_3$ can be obtained.

(B) In an alternative method, the surface treatment agent is added to an aqueous slurry containing titanium oxide particles, the pH is then adjusted to about 6 to 7 by an acid or an alkali, titanium dioxide particles are coated with the surface treatment agent, and then the aqueous slurry is filtrated by filter press, drum filter, or the like, and washed to rinse away off remaining salts. After then, the resultant is dried with a band dryer, a spray dryer, or the like, to obtain a dried material. Subsequently, the dried product is fired at a temperature in a range of 400 to 1,000° C., and preferably 500 to 900° C., by an appropriate means such as an electric furnace or a rotary-type firing furnace. Thus, titanium oxide particles each having a surface coated with $Al_2O_3$ can be obtained as a fired lump.

The resulting fired lump may be ground as it is with a fluid energy mill, or may be ground as an aqueous slurry with a bead mill, followed by steps of filtrating, water-washing, and drying, and ground with a fluid energy mill.

In (A) and (B) above, when the dried material is ground, an appropriate organic treatment agent may be used, if necessary. Examples of such an organic treatment agent may include a polyhydric alcohol, alkanolamine, silicone oil, a silane coupling agent, and a titanium coupling agent.

The amount of the surface treatment agent used with respect to titanium oxide particles can be determined by adjusting the amount of the surface treatment agent added to the aqueous slurry depending on the necessary amount of titanium oxide particles in the light-reflective insulating particles.

When the amount of titanium oxide contained in the light-reflective insulating particles is too low (that is, the amount of the metal oxide present on the surface of the titanium oxide particles is large, and the thickness of a metal oxide surface treatment film is too large), utilization of high refractive index of titanium oxide tends to be difficult. On the contrary, when it is too high (that is, the amount of the metal oxide present on the surface of the titanium oxide particles is small, and the thickness of the metal oxide surface treatment is too small), the photocatalytic action of the titanium oxide particles may not be sufficiently inhibited.

It is thus preferably 80 to 96%, and more preferably 85 to 93%, in terms of number of atoms. The value can be obtained by X-ray fluorescence analysis.

The light-reflective insulating particle having a titanium oxide particle as a core particle may be substantially spherical, scale-shaped, amorphous, or needle-shaped. In consideration of reflective efficiency, dispersibility in a resin composition, handling property of surface treatment with a metal oxide, and the like, a substantially spherical shape is preferable.

Further, since titanium oxide as the core particle has a high refractive index, as the particle diameter of such a substantially spherical light-reflective insulating particle, a particle diameter smaller than that of zinc oxide which has a particle diameter of 0.5 µm or more and is widely used as a light reflective agent can be used. Deterioration of the reliability of anisotropic conductive connection depending on blending of the light-reflective insulating particles may be prevented. On the other hand, when the particle diameter is too small, the light reflectance tends to be reduced. Therefore, the particle diameter is preferably 0.1 to 10 µm, and particularly preferably 0.2 to 0.3 µm. Further, this range is effective in flip-chip mounting of an LED element emitting blue light with the use of the light-reflective anisotropic conductive adhesive.

The refractive index (JIS K7142) of the light-reflective insulating particles is preferably larger than that of the cured product of the thermosetting resin composition, and more preferably larger than that by at least about 0.02. This is because a small difference of the refractive index decreases the light reflectance on an interface therebetween.

In the present invention, light-reflective insulating particles other than the above-described light-reflective insulating particles formed by performing a surface treatment of titanium oxide particles with a metal oxide can be used in combination within a range of an amount not impairing the effects of the present invention. Examples of such light-reflective insulating particles used in combination may include resin-coated metal particles formed by coating the surface of metal particles with a transparent insulating resin. Examples of the metal particles may include nickel, silver, and aluminum. Examples of the shape of the particles may include amorphous, spherical, scale-shaped, and needle-shaped shapes. Among these, from the viewpoint of light diffusion effect, a spherical shape is preferable, and from the viewpoint of total reflection effect, a scale-shaped shape is preferable. From the viewpoint of light reflectance, a scale-shaped or spherical silver particle is particularly preferable, and in particular, a scale-shaped silver particle is more preferable.

The size of such resin-coated metal particles is different according to the shape. In general, however, when the size is too large, connection due to anisotropic conductive particles may be inhibited, and when it is too small, light is unlikely to be reflected. Therefore, the particle diameter of spherical particles is preferably 0.1 to 30 µm, and more preferably 0.2 to 10 µm. For a scale-shaped particle, the long diameter is preferably 0.1 to 100 µm, and more preferably 1 to 50 µm and the thickness is preferably 0.01 to 10 and more preferably 0.1 to 5 µm.

Here, when the particles have an insulating coating, the size of the light-reflective insulating particles is a size including the insulating coating.

As a resin in such resin-coated metal particles, various insulating resins may be used. From the viewpoints of mechanical strength, transparency, and the like, a cured product of acrylic resin can be preferably used. Example thereof may include a resin that is formed by radical copolymerization of methyl methacrylate and 2-hydroxyethyl methacrylate in the presence of a radical polymerization initiator, such as benzoyl peroxide and other organic peroxides. In this case, it is more preferable that the resin be cross-linked with an isocyanate-based cross-linking agent such as 2,4-tolylene diisocyanate. For the metal particles, it is preferable that a γ-glycidoxy group, a vinyl group, or the like have been introduced into the surface of metal in advance with a silane coupling agent.

For example, the resin-coated metal particles can be produced by adding metal particles and a silane coupling agent to a solvent such as toluene, stirring the mixture at room temperature for about 1 hour, adding a radical monomer, a radical polymerization initiator, and if necessary, a cross-linking agent to the mixture, and stirring the mixture while heating the mixture to an initiating temperature of radical polymerization.

When the amount of the light-reflective insulating particles added in the light-reflective anisotropic conductive adhesive is too small, light reflection cannot be sufficiently achieved. When it is too large, connection due to the used conductive particles is inhibited. Therefore, the amount of the light-reflective insulating particles used relative to the thermosetting resin composition is preferably 1 to 50% by volume, and more preferably 2 to 25% by volume.

As the conductive particles constituting the light-reflective anisotropic conductive adhesive of the present invention, metal particles used in conventional conductive particles for anisotropic conductive connection can be used. Examples thereof may include gold, nickel, copper, silver, solder, palladium, aluminum, an alloy thereof, and a multi-layering material thereof (for example, nickel plating/gold flash plating material). Since conductive particles of gold, nickel, or copper among them are brown, the particles can enjoy the benefits of the present invention more than the other metal materials.

Examples of the shape of metal particles used as the conductive particles may include a spherical shape and a flaky shape. A spherical shape is preferable. When the particle diameter thereof is too large, connection reliability deteriorates. Therefore, the particle diameter is preferably 1 to 20 µm, more preferably 2 to 10 µm, and particularly preferably 3 to 6 µm.

Further, as the conductive particles, metal-coated resin particles in which resin particles are coated with a metal material can be used. Examples of such resin particles may include a styrene-based resin particle, a benzoguanamine resin particle, and a nylon resin particle. As a method of coating resin particles with a metal material, any conventionally known method can be used, and an electroless plating method, an electrolytic plating method, or the like can be used. The thickness of layer of the metal material for coating is enough to ensure favorable connection reliability, and depends on the particle diameter of the resin particles or a kind of metal. It is generally 0.1 to 3 µm.

When the particle diameter of the resin particles is too small, conduction failure is likely to occur, and when it is too large, patterns are likely to be short-circuited. Therefore, it is preferably 1 to 20 µm, more preferably 3 to 10 µm, and particularly preferably 3 to 5 µm. In this case, it is preferable that the shape of the resin particles be spherical. Further, the shape may be flaky or a rugby ball shape.

The metal-coated resin particles are preferably spherical. When the particle diameter thereof is too large, connection reliability deteriorates. Therefore, it is preferably 1 to 20 μm, more preferably 2 to 10 μm, and particularly preferably 3 to 6 μm.

Figure 1B:
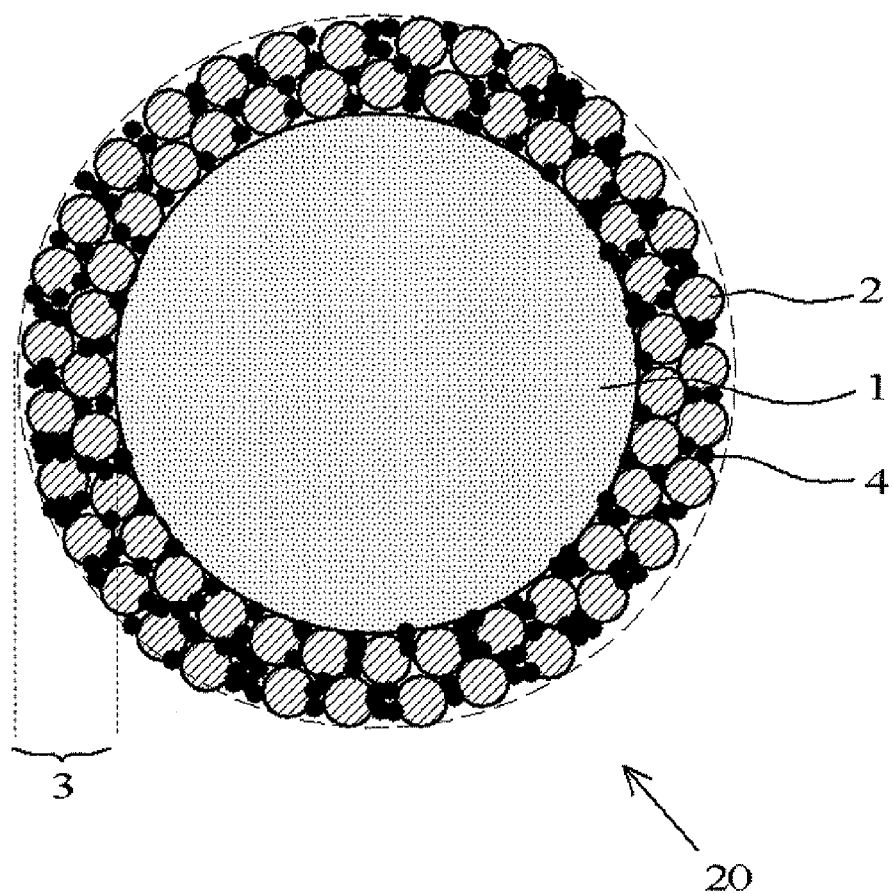
FIG. 1B is a cross-sectional view of a light-reflective conductive particle for an anisotropic conductive adhesive.

In the present invention, it is particularly preferable that light reflectivity be imparted to the conductive particles as described above to form light-reflective conductive particles. FIGS. 1A and 1B are cross-sectional views of such light-reflective conductive particles 10 and 20, respectively. The light-reflective conductive particle in FIG. 1A will be first described.

A light-reflective conductive particle 10 includes a core particle 1 coated with a metal material, and a light-reflective layer 3 made from at least one kind of inorganic particles 2 selected from zinc oxide (ZnO) particles and aluminum oxide ($Al_2O_3$) particles on the surface of the core particle. The zinc oxide particles or aluminum oxide particles are inorganic particles taking on white under the sun light. Therefore, the light-reflective layer 3 made from the particles takes on white to gray color. The white to gray color of the light-reflective layer means that the wavelength dependency of light reflective properties to the visible light is low and the visible light is likely to reflect.

When photodeterioration of the cured product of the thermosetting resin composition of the cured light-reflective anisotropic conductive adhesive is concerned, among zinc oxide particles and aluminum oxide particles, the zinc oxide particles that have no catalytic property with respective to the photodeterioration and have a high refractive index can be preferably used.

Since the core particle 1 serves to anisotropic conductive connection, the surface of the core particle is made from a metal material. Examples of aspects of the surface coated with a metal material herein may include an aspect in which the core particle 1 itself is a metal material (for example, nickel, solder, and copper), and an aspect in which the surface of a resin particle is coated with a metal material like the above-described metal-coated resin particles.

From the viewpoint of size relative to the particle diameter of the core particle 1, when the thickness of the light-reflective layer 3 made from the inorganic particles 2 is too small as compared with the particle diameter of the core particle 1, the reflectance is significantly decreased, and when it is too large, conduction failure occurs. Therefore, it is preferably 0.5 to 50%, and more preferably 1 to 25%.

When the particle diameter of the inorganic particles 2 constituting the light-reflective layer 3 in the light-reflective conductive particle 10 is too small, a light reflection phenomenon is unlikely to occur, and when it is too large, formation of the light-reflective layer tends to be difficult. Therefore, it is preferably 0.02 to 4 μm, more preferably 0.1 to 1 μm, and particularly preferably 0.2 to 0.5 μm. In this case, from the viewpoint of wavelength of light to be reflected, it is preferable that the particle diameter of the inorganic particles 2 be equal to or more than 50% of wavelength of the light to be reflected (that is, the light emitted by the light-emitting device) so that the light to be reflected does not penetrate. In this case, examples of the shape of the inorganic particles 2 may include amorphous, spherical, scale-shaped, and needle-shaped shapes. Among these, from the viewpoint of light diffusion effect, a spherical shape is preferable, and from viewpoint of total reflection effect, a scale-shaped shape is preferable.

The light-reflective conductive particle 10 in FIG. 1A can be produced by any known film formation technique (so-called mechano-fusion method) in which powders of various sizes physically collide to each other to form a film made from particles having a smaller particle diameter on the surface of particles having a larger particle diameter. In this case, the inorganic particles 2 are fixed to the metal material on the surface of the core particle 1 so as to enter into the metal material. Further, the inorganic particles 2 are unlikely to be fixed by fusion, and therefore a monolayer of the inorganic particles 2 constitutes the light-reflective layer 3. In FIG. 1A, the thickness of the light-reflective layer 3 may be equal to or slightly less than the particle diameter of the inorganic particles 2.

Next, the light-reflective conductive particle 20 in FIG. 1B will be described. The light-reflective conductive particle 20 is different from the light-reflective conductive particle 10 in FIG. 1A in that a light-reflective layer 3 contains a thermoplastic resin 4 functioning as an adhesive, that inorganic particles 2 are fixed by the thermoplastic resin 4, and that multi-layers (for example, two layers or three layers) of the inorganic particles 2 are formed. The thermoplastic resin 4 contained in the light-reflective conductive particle 20 improves the mechanical strength of the light-reflective layer 3, and therefore the inorganic particles 2 are unlikely to be separated.

As the thermoplastic resin 4, a halogen-free thermoplastic resin can be preferably used for reduction of the load on the environment. For example, polyolefin such as polyethylene and polypropylene, polystyrene, acrylic resin, or the like, can be preferably used.

Such a light-reflective conductive particle 20 can also be produced by the mechano-fusion method. When the particle diameter of the thermoplastic resin 4 applicable to the mechano-fusion method is too small, the adhesion function deteriorates, and when it is too large, the thermoplastic resin 4 is unlikely to adhere to the core particle. Therefore, it is preferably 0.02 to 4 μm, and more preferably 0.1 to 1 μm. Further, when the amount of the thermoplastic resin 4 added is too small, the adhesion function deteriorates, and when it is too large, agglomerates of the particles are formed. Therefore, it is preferably 0.2 to 500 parts by mass, and more preferably 4 to 25 parts by mass, relative to 100 parts by mass of the inorganic particle 2.

As the thermosetting resin composition used for the light-reflective anisotropic conductive adhesive of the present invention, a material that is as colorless and transparent as possible is preferably used. This is because the light reflective efficiency of the light-reflective conductive particles in the anisotropic conductive adhesive is not decreased, and the incident light is reflected without change in the color of the incident light. The colorless and transparent used herein means that a cured product of the thermosetting resin composition has a light transmittance (JIS K7105) for a light path length of 1 cm of 80% or more, and preferably 90% or more, relative to the visible light having a wavelength of 380 to 780 nm.

In the light-reflective anisotropic conductive adhesive of the present invention, when the amount of the conductive particles, such as light-reflective conductive particles, added relative to 100 parts by mass of the thermosetting resin composition is too small, conduction failure is likely to occur, and when it is too large, patterns are likely to be short-circuited. Therefore, it is preferably 1 to 100 parts by mass, and more preferably 10 to 50 parts by mass.

As to the light reflective property of the light-reflective anisotropic conductive adhesive of the present invention, it is desirable that the cured product of the light-reflective anisotropic conductive adhesive have a reflectance (JIS K7105) to the light having a wavelength of 450 nm of at least 30% to improve the light-emitting efficiency of the light-emitting element. In order to obtain such a light reflectance, the light reflective property and the added amount of the used light-reflective conductive particles, the mixed composition of the thermosetting resin composition, and the like, may be appropriately adjusted. In general, as the amount of the added light-reflective conductive particles having a favorable reflection property is increased, the reflectance is also likely to increase.

Further, from the viewpoint of refractive index, the light reflective property of the light-reflective anisotropic conductive adhesive can be evaluated. This is because when the refractive index of the cured product is larger than the refractive index of cured product of the thermosetting resin composition except for the conductive particles and the light-reflective insulating particles, the light reflection amount on the interface between the light-reflective insulating particles and the cured product of the thermosetting resin composition surrounding the particles is increased. Specifically, it is desirable that a difference subtracting the refractive index (JIS K7142) of the cured product of the thermosetting resin composition from that of the light-reflective insulating particles be preferably 0.02 or more, and more preferably 0.2 or more. The refractive index of the cured product of a thermosetting resin composition containing an epoxy resin as a main component is usually about 1.5.

As the thermosetting resin composition constituting the light-reflective anisotropic conductive adhesive of the present invention, a composition used in a conventional anisotropic conductive adhesive and anisotropic conductive film can be used. In general, such a thermosetting resin composition is obtained by adding a curing agent to an insulating binder resin. Preferable examples of the insulating binder resin may include epoxy resins containing an alicyclic epoxy compound, a heterocyclic epoxy compound, or a hydrogenated epoxy compound as a main component.

Preferable examples of the alicyclic epoxy compound may include compounds having two or more epoxy groups in their molecules. These may be liquid or solid. Specific examples thereof may include glycidyl hexahydrobisphenol A, and 3,4-epoxycyclohexenylmethyl-3',4'-epoxycyclohexene carboxylate. Among these, in terms that the cured product can secure the light permeability suitable for mounting of an LED element and have excellent rapid curing property, 3,4-epoxycyclohexenylmethyl-3',4'-epoxycyclohexene carboxylate can be preferably used.

Examples of the heterocyclic epoxy compound may include epoxy compounds having a triazine ring. In particular, preferable examples thereof may include 1,3,5-tris(2,3-epoxypropyl)-1,3,5-triazine-2,4,6-(1H,3H,5H)-trione.

As the hydrogenated epoxy compound, hydrogenated compounds of the alicyclic epoxy compound and the heterocyclic epoxy compound described above, and another known hydrogenated epoxy resin can be used.

The alicyclic epoxy compound, the heterocyclic epoxy compound, and the hydrogenated epoxy compound may be used alone, or two or more kinds thereof may be used in combination. Another epoxy compound may be used in combination with these epoxy compounds as long as the effects of the present invention are not impaired. Examples thereof may include glycidyl ethers obtained by reacting epichlorohydrin with a polyhydric phenol such as bisphenol A, bisphenol F, bisphenol S, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol novolac, and cresol novolac; polyglycidyl ethers obtained by reacting epichlorohydrin with an aliphatic polyhydric alcohol such as glycerol, neopentyl glycol, ethylene glycol, propylene glycol, butylene glycol, hexylene glycol, polyethylene glycol, and polypropylene glycol; glycidyl ether esters obtained by reacting epichlorohydrin with a hydroxycarboxylic acid such as p-hydroxybenzoic acid and β-hydroxynaphthoic acid; polyglycidyl esters obtained from a polycarboxylic acid such as phthalic acid, methylphthalic acid, isophthalic acid, terephthalic acid, tetrahydrophthalic acid, endomethylenetetrahydrophthalic acid, endomethylenehexahydrophthalic acid, trimellitic acid, and polymerizable fatty acid; glycidylaminoglycidyl ethers obtained from aminophenol and aminoalkylphenol; glycidylaminoglycidyl esters obtained from aminobenzoic acid; glycidylamines obtained from aniline, toluidine, tribromoaniline, xylylenediamine, diaminocyclohexane, bisaminomethylcyclohexane, 4,4'-diaminodiphenylmethane, and 4,4'-diaminodiphenyl sulfone; and known epoxy resins such as epoxidized polyolefin.

As the curing agent, an acid anhydride, an imidazole compound, or cyanogen can be used. Among them, an acid anhydride-based curing agent that is difficult to change the color of the cured product, and particularly an alicyclic acid anhydride-based curing agent can be preferably used. Specifically, preferable examples may include methylhexahydrophthalic anhydride.

In the thermosetting resin composition of the light-reflective anisotropic conductive adhesive of the present invention, the alicyclic epoxy compound and the alicyclic acid anhydride-based curing agent can be used. In this case, when the use amount of the alicyclic acid anhydride-based curing agent is too small, the amount of an uncured epoxy compound becomes large, and when it is too large, corrosion of a material to be attached tends to be promoted by the influence of excessive curing agent. Therefore, the alicyclic acid anhydride-based curing agent is preferably used in a ratio of 80 to 120 parts by mass, and more preferably 95 to 105 parts by mass, relative to 100 parts by mass of the alicyclic epoxy compound.

The light-reflective anisotropic conductive adhesive of the present invention can be produced by uniformly mixing the light-reflective insulating particles, the conductive particles (preferably light-reflective conductive particles), and the thermosetting resin composition. Further, when a light-reflective anisotropic conductive film is formed, they may be dispersed and mixed in a solvent such as toluene, and the mixture may be applied to a PET film having been subjected to a peeling treatment so as to be a desired thickness, and dried at about 80° C.

Figure 2:
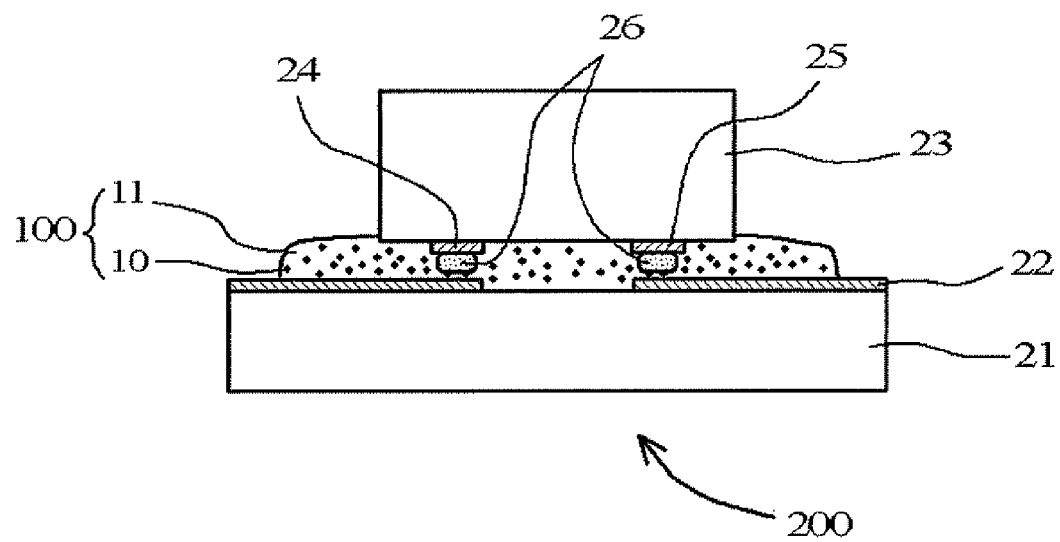
FIG. 2 is a cross-sectional view of a light-emitting device of the present invention.
Figure 3:
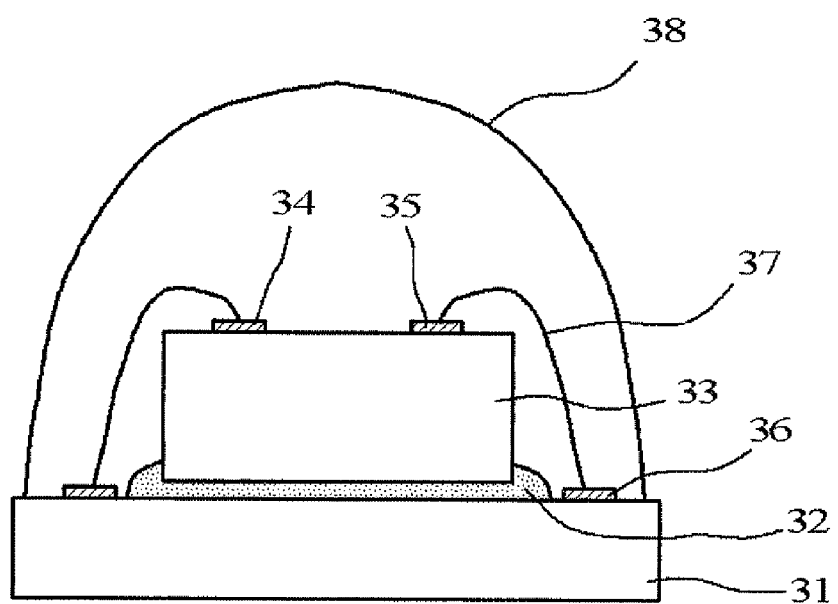
FIG. 3 is a cross-sectional view of a conventional light-emitting device.
Figure 4:
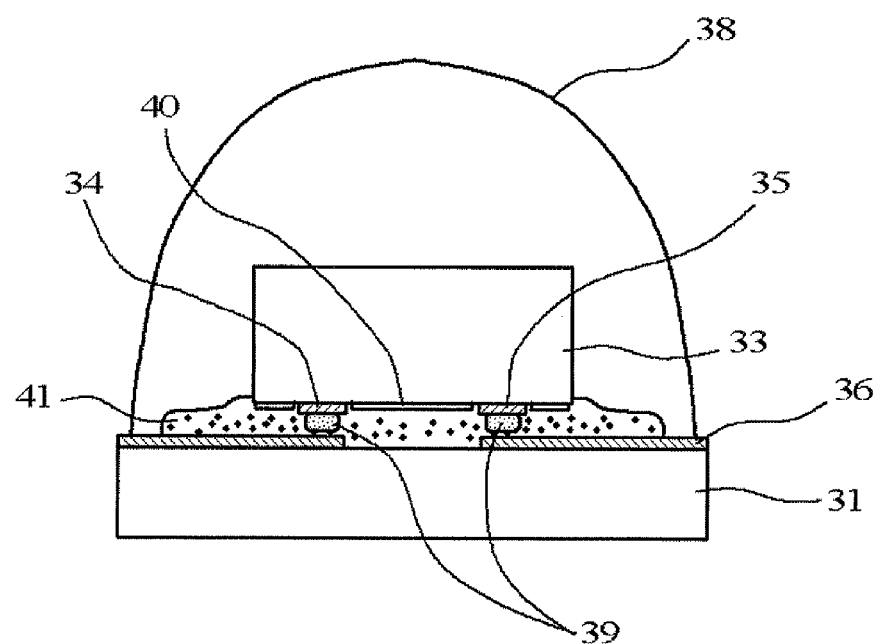
FIG. 4 is a cross-sectional view of the conventional light-emitting device.

Next, the light-emitting device of the present invention will be described with reference to FIG. 2. A light-emitting device 200 is formed by flip-chip mounting a substrate 21 and an LED element 23, with the above-described light-reflective anisotropic conductive adhesive of the present invention applied between a connection terminal 22 on the substrate 21 and connection bumps 26 respectively formed on an n electrode 24 and a p electrode 25 of the LED element 23 which is a light-emitting element. A cured product 100 of the light-reflective anisotropic conductive adhesive in FIG. 2 is obtained by dispersing light-reflective insulating particles (not shown) and light-reflective conductive particles 10 in a cured product 11 of the thermosetting resin composition. A light-non-reflective conductive particle can be used instead of the light-reflective conductive particle 10. Optionally, the entire LED element 23 may be sealed with a transparent mold resin. Further, a light-reflective layer may be provided to the LED element 23 as done conventionally.

In the thus configured light-emitting device 200, of beams of light emitted by the LED element 23, beams of light emitted toward a side of the substrate 21 are reflected on the light-reflective insulating particles and the light-reflective conductive particles 10 in the cured product 100 of the light-reflective anisotropic conductive adhesive, and are output from the upper face of the LED element 23. Therefore, deterioration in the light-emitting efficiency can be prevented.

Components (LED element 23, bumps 26, substrate 21, connection terminals 22, and the like) other than the light-reflective anisotropic conductive adhesive in the light-emitting device 200 of the present invention may be the same components of the conventional light-emitting device. Further, the light-emitting device 200 of the present invention can be produced through any conventional anisotropic conductive connection technique except for use of the light-reflective anisotropic conductive adhesive of the present invention. As the light-emitting element, any known light-emitting element in addition to the LED element can be used within a range not impairing the effects of the present invention.

EXAMPLES

Example 1

To a colorless and transparent thermosetting epoxy binder composition having a refractive index of about 1.50 (YX-8000, containing 50% by mass of MeHHPA available from JER), 12% by volume of the following light-reflective insulating particles 1 and 10% by mass of Au-coated resin conductive particles having an average particle diameter of 5 μm as conductive particles (which were particles formed by coating spherical acrylic resin particles having an average particle diameter of 4.6 μm with an electroless gold plating having a thickness of 0.2 μm (BRIGHT 20GNB4.6EH, available from Nippon Chemical Industrial Co., LTD.)) were uniformly mixed, to obtain a light-reflective anisotropic conductive adhesive of which the external appearance color was white.

(Light Reflectance Evaluation Test)

The obtained light-reflective anisotropic conductive adhesive was applied to a white ceramic board so that the dried thickness was 100 μm, and the adhesive was heated at 200° C. for 1 minute and cured. The reflectance (JIS K7150) of the cured product with respect to a light having a wavelength of 450 nm was measured with a spectrophotometer (U3300, Hitachi, Lid.). The obtained results are shown in Table 1. In practice, the reflectance is desirably 30% or more.

(Total Luminous Flux Evaluation Test in LED Mounting Sample)

An Au-bump having a height of 15 μm was formed on a glass epoxy substrate having wirings in which copper wirings having a pitch of 100 μm had been Ni/Au plated (5.0 μm/0.3 μm in thickness) with a bump holder (FB700, Kaijo Corporation). A blue LED (Vf=3.2 (If=20 mA)) was flip-chip mounted on the epoxy substrate with the Au bump using the light-reflective anisotropic conductive adhesive under conditions of 200° C., 60 seconds, and 1 Kg/chip, to obtain an LED module for tests.

For the obtained LED module for tests, the total luminous flux was measured with a total luminous flux measurement system (integrating sphere type) (LE-2100, Otsuka Electronics Co., Ltd.) (measurement condition: If 20 mA (constant-current control)). The obtained results are shown in Table 1. The total luminous flux is desirably 300 mlm or more in practical.

(Light Fastness Test)

An LED module for tests applied to the total luminous flux evaluation test was formed again, and continuously turned on under aging conditions (85° C., 85% RH, and 500 hours). The total luminous flux of the LED module for tests was measured before (initial) and after the aging in the same manner as in the total luminous flux evaluation test, and was evaluated according to the following criteria for evaluation. In practice, the evaluation is desirably at least "B."

<Criteria for Evaluation>

AA: the ratio (%) of decrease in the total luminous flux after aging relative to that before aging is less than 5%

A: the ratio (%) of decrease in the total luminous flux after aging relative to that before aging is 5% or more and less than 10%

B: the ratio (%) of decrease in the total luminous flux after aging relative to that before aging is 10% or more and less than 20%

C: the ratio (%) of decrease in the total luminous flux after aging relative to that before aging is 20% or more

Example 2

A light-reflective anisotropic conductive adhesive having a white external appearance was obtained in the same manner as in Example 1 except that the amount of added light-reflective insulating particles was changed to 7% by volume. Similarly to Example 1, the light reflectance evaluation test, and the total luminous flux evaluation test and the light fastness test for the LED mounting sample were performed. The obtained results are shown in Table 1.

Example 3

A light-reflective anisotropic conductive adhesive having a white external appearance was obtained in the same manner as in Example 1 except that the amount of added light-reflective insulating particles was changed to 21% by volume. Similarly to Example 1, the light reflectance evaluation test, and the total luminous flux evaluation test and the light fastness test for the LED mounting sample were performed. The obtained results are shown in Table 1.

Example 4

A light-reflective anisotropic conductive adhesive having a white external appearance was obtained in the same manner as in Example 1 except that a Ni-coated rein conductive particles (particles formed by coating spherical acrylic resin particles having an average particle diameter of 4.6 μm with an electroless nickel plating having a thickness of 0.2 μm) was used instead of the Au-coated resin conductive particles. Similarly to Example 1, the light reflectance evaluation test, and the total luminous flux evaluation test and the light fastness test for the LED mounting sample were performed. The obtained results are shown in Table 1.

Examples 5 to 10 and Comparative Example 1

A light-reflective anisotropic conductive adhesive having a white external appearance in each of Examples 5 to 10 and Comparative Example 1 was obtained in the same manner as in Example 1 except that each of the following light-reflective insulating particles 2 to 8 was used. Similarly to Example 1, the light reflectance evaluation test, and the total luminous flux evaluation test and the light fastness test for the LED mounting sample were performed. The obtained results are shown in Table 1.

<Light-Reflective Insulating Particles 1 (Used in Examples 1 to 4)>

Titanium oxide particles having been subjected to a surface treatment with $Al_2O_3$ and $SiO_2$ (KR-380, Titan Kogyo, Ltd.: particle diameter: 0.5 μm, titanium content: 94%)

<Light-Reflective Insulating Particles 7 (Used in Example 10)>

Titanium oxide particles having been subjected to a surface treatment with $Al_2O_3$ (R-11P, Titan Kogyo, Ltd.: particle diameter: 0.2 μm, titanium content: 95% or slightly more than 95%)

<Light-Reflective Insulating Particles 8 (Used in Comparative Example 1)>

Titanium oxide particles not having been subjected to a surface treatment with metal oxide (R-310, Titan Kogyo, Ltd.: particle diameter: 0.2 μm, titanium content: 97% or slightly more than 97%)

TABLE 1

|  |  | Example | | | | | | | | | | Comparative |
|---|---|---|---|---|---|---|---|---|---|---|---|---|
|  |  | 1 | 2 | 3 | 4 | 5 | 6 | 7 | 8 | 9 | 10 | Example 1 |
| Conductive particle | Surface metal | Au | Au | Au | Ni | Au | Au | Au | Au | Au | Au | Au |
|  | Particle diameter (μm) | 5 | 5 | 5 | 5 | 5 | 5 | 5 | 5 | 5 | 5 | 5 |
| Light-reflective insulating particle | Number | 1 | 1 | 1 | 1 | 2 | 3 | 4 | 5 | 6 | 7 | 8 |
|  | Kind | $TiO_2$ | $TiO_2$ | $TiO_2$ | $TiO_2$ | $TiO_2$ | $TiO_2$ | $TiO_2$ | $TiO_2$ | $TiO_2$ | $TiO_2$ | $TiO_2$ |
|  | Particle diameter (μm) | 0.5 | 0.5 | 0.5 | 0.5 | 0.23 | 0.26 | 0.23 | 0.23 | 0.25 | 0.2 | 0.2 |
|  | Refractive index n1 | 2.71 | 2.71 | 2.71 | 2.71 | 2.71 | 2.71 | 2.71 | 2.71 | 2.71 | 2.71 | 2.71 |
|  | Volume % | 12 | 7 | 21 | 12 | 12 | 12 | 12 | 12 | 12 | 12 | 12 |
|  | Surface treatment | $Al_2O_3$ $SiO_2$ — | $Al_2O_3$ $SiO_2$ — | $Al_2O_3$ $SiO_2$ — | $Al_2O_3$ $SiO_2$ — | $Al_2O_3$ $SiO_2$ — | $Al_2O_3$ $SiO_2$ $ZrO_2$ | $Al_2O_3$ $SiO_2$ — | $Al_2O_3$ $SiO_2$ $ZnO$ | $Al_2O_3$ — — | $Al_2O_3$ — — | — — — |
|  | $TiO_2$ (%) | 94 | 94 | 94 | 94 | ≥85 | ≥88 | ≥90 | ≥93 | ≥94 | ≥95 | ≥97 |
| Light-reflective anisotropic conductive adhesive | Color | White | White | White | White | White | White | White | White | White | White | White |
|  | Reflectance (%) | 62 | 51 | 70 | 68 | 64 | 65 | 66 | 68 | 69 | 69 | 70 |
|  | Total luminous flux (mlm) | 390 | 370 | 420 | 420 | 390 | 400 | 400 | 410 | 410 | 420 | 420 |
|  | Light fastness test | B | B | B | B | A | AA | A | A | B | B | C |

<Light-Reflective Insulating Particles 2 (Used in Example 5)>

Titanium oxide particles having been subjected to a surface treatment with $Al_2O_3$ and $SiO_2$ (R-7E, Titan Kogyo, Ltd.: particle diameter: 0.23 μm, titanium content: 85% or slightly more than 85%)

<Light-Reflective Insulating Particles 3 (Used in Example 6)>

Titanium oxide particles having been subjected to a surface treatment with $Al_2O_3$, $SiO_2$, and $ZrO_2$ (D-918, Titan Kogyo, Ltd.: particle diameter: 0.26 μm, titanium content: 88% or slightly more than 88%)

<Light-Reflective Insulating Particles 4 (Used in Example 7)>

Titanium oxide particles having been subjected to a surface treatment with $Al_2O_3$ and $SiO_2$ (R-3L, Titan Kogyo, Ltd.: particle diameter: 0.23 μm, titanium content: 90% or slightly more than 90%)

<Light-Reflective Insulating Particles 5 (Used in Example 8)>

Titanium oxide particles having been subjected to a surface treatment with $Al_2O_3$, $SiO_2$, and $ZnO$ (R-650, Titan Kogyo, Ltd.: particle diameter: 0.23 μm, titanium content: 93% or slightly more than 93%)

<Light-Reflective Insulating Particles 6 (Used in Example 9)>

Titanium oxide particles having been subjected to a surface treatment with $Al_2O_2$ (SR-1, Titan Kogyo, Ltd.: particle diameter: 0.25 μm, titanium content: 94% or slightly more than 94%)

As shown in Table 1, in the light-reflective anisotropic conductive adhesives containing light-reflective insulating particles in Examples 1 to 10, each light reflectance was 30% or more, and blue light of 450 nm was reflected as it was. Further, each of the total luminous fluxes was 300 mlm or more. Each of the light fastnesses was evaluated as at least "B."

In contrast, in Comparative Example 1, since the titanium oxide particles not having been subjected to a surface treatment with metal oxide were used, the reflectance and total luminous flux were good, but the result in the light fastness test was "C."

INDUSTRIAL APPLICABILITY

Even when a light-reflective layer that may increase production cost is not provided to the light-emitting element during production of a light-emitting device by flip-chip mounting a light-emitting element such as a light-emitting diode (LED) element on a wiring substrate with an anisotropic conductive adhesive, the light-reflective anisotropic conductive adhesive of the present invention can prevent the light-emitting efficiency from being decreased. Further, the light fastness is excellent. Therefore, the light-reflective anisotropic conductive adhesive of the present invention is useful in flip-chip mounting of an LED element.

REFERENCE SIGNS LIST

1 Core particle
2 Inorganic particle
3 Light-reflective layer
4 Thermoplastic resin
10, 20 light-reflective conductive particle
11 Cured product of thermosetting resin composition
21 Substrate
22 Connection terminal
23 LED element
24 n electrode
25 p electrode
26 Bump
31 Substrate
32 Die bond adhesive
33 LED element
34 p electrode
35 n electrode
36 Connecting terminal
37 Gold wire
38 Transparent mold resin
39 Bump
40 Light-reflective layer
41 Anisotropic conductive paste
100 Cured product of light-reflective anisotropic conductive adhesive
200 Light-emitting device

The invention claimed is:

1. A light-reflective anisotropic conductive adhesive used for anisotropic conductive connection of a light-emitting element to a wiring substrate, the light-reflective anisotropic conductive adhesive comprising a thermosetting resin composition, conductive particles, and light-reflective insulating particles, wherein
the light-reflective insulating particles are titanium oxide particles subjected to a surface treatment with a metal oxide, and
the metal oxide is SiO.

2. The light-reflective anisotropic conductive adhesive according to claim 1, wherein an amount of the titanium oxide contained in the light reflective insulating particles is 85 to 93% in terms of number of atoms.

3. The light-reflective anisotropic conductive adhesive according to claim 1, wherein the light-reflective insulating particle has a spherical shape.

4. The light-reflective anisotropic conductive adhesive according to claim 1, wherein the light-reflective insulating particles have a particle diameter of 0.2 to 0.3 µm, and the conductive particles have a particle diameter of 2 to 10 µm.

5. The light-reflective anisotropic conductive adhesive according to claim 1, wherein the light-reflective insulating particles have a larger refractive index than a cured product of the thermosetting resin composition.

6. The light-reflective anisotropic conductive adhesive according to claim 1, comprising resin-coated metal particles as the light-reflective insulating particles in addition to the light-reflective insulating particles obtained by subjecting titanium oxide particles to a surface treatment with the metal oxide.

7. The light-reflective anisotropic conductive adhesive according to claim 6, wherein the resin-coated metal particles are scale-shaped silver particles.

8. The light-reflective anisotropic conductive adhesive according to claim 1, wherein an amount of the light-reflective insulating particles added relative to the thermosetting resin composition is 1 to 50% by volume.

9. The light-reflective anisotropic conductive adhesive according to claim 1, wherein the conductive particle is a light-reflective conductive particle including a core particle coated with a metal material to form a metal surface on the core particle, and a light-reflective layer formed from at least one kind of inorganic particles selected from zinc oxide particles and aluminum oxide particles on the metal surface of the core particle.

10. The light-reflective anisotropic conductive adhesive according to claim 9, wherein the conductive particle is the light-reflective conductive particle including the core particle coated with the metal material, and the light-reflective layer formed from the zinc oxide particles on the metal surface of the core particle.

11. The light-reflective anisotropic conductive adhesive according to claim 9, wherein the core particle is a resin particle of which surface is coated with the metal material.

12. The light-reflective anisotropic conductive adhesive according to claim 9, wherein the core particle has a particle diameter of 0.5 to 50% of a thickness of the light-reflective layer.

13. The light-reflective anisotropic conductive adhesive according to claim 1, wherein a cured product of the thermosetting resin composition has a light transmittance (JIS K7105) for a light path length of 1 cm of 80% or more relative to the visible light having a wavelength of 380 to 780 nm.

14. The light-reflective anisotropic conductive adhesive according to claim 1, wherein the thermosetting resin composition includes an epoxy resin and an acid anhydride-based curing agent.

15. The light-reflective anisotropic conductive adhesive according to claim 9, wherein an amount of the light reflective conductive particles added relative to 100 parts by mass of the thermosetting resin composition is 1 to 100 parts by mass.

16. The light-reflective anisotropic conductive adhesive according to claim 1, wherein a cured product of the light-reflective anisotropic conductive adhesive has a reflectance (JIS K7105) to light having a wavelength of 450 nm of at least 30%.

17. A light-emitting device produced by flip-chip mounting a light-emitting element on a wiring substrate through the light-reflective anisotropic conductive adhesive according to claim 1.

18. The light-emitting device according to claim 17, wherein the light-emitting element is a light-emitting diode.

* * * * *